US009564115B2

(12) United States Patent
Li et al.

(10) Patent No.: US 9,564,115 B2
(45) Date of Patent: Feb. 7, 2017

(54) PRODUCING SOUNDS IN A VIRTUAL WORLD AND RELATED SOUND CARD

(75) Inventors: Qi Cheng Li, Beijing (CN); Jian Wang, Beijing (CN); Yi Min Wang, Beijing (CN); Zi Yu Zhu, Beijing (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1147 days.

(21) Appl. No.: 13/403,974

(22) Filed: Feb. 23, 2012

(65) Prior Publication Data

US 2012/0219164 A1    Aug. 30, 2012

(30) Foreign Application Priority Data

Feb. 28, 2011    (CN) .......................... 2011 1 0051604

(51) Int. Cl.
| | | |
|---|---|---|
| *G06F 17/00* | (2006.01) | |
| *H03G 5/00* | (2006.01) | |
| *G10H 5/00* | (2006.01) | |
| *G05B 15/02* | (2006.01) | |
| *G06F 17/50* | (2006.01) | |

(52) U.S. Cl.
CPC ............... *G10H 5/007* (2013.01); *G05B 15/02* (2013.01); *G06F 17/5009* (2013.01); *G10H 2220/351* (2013.01); *G10H 2250/435* (2013.01); *H04R 2201/029* (2013.01)

(58) Field of Classification Search
CPC .................. H04R 2201/029; G10H 2220/315; G10H 2250/00; G10H 2250/315; G10H 2250/435; G10H 5/007; H03G 3/00; G06F 17/5009; G05B 15/02

USPC ......... 381/98, 310, 61–65; 700/94; 345/419, 345/420; 703/2, 13–14
See application file for complete search history.

(56) References Cited

U.S. PATENT DOCUMENTS

| | | | |
|---|---|---|---|
| 5,977,469 A * | 11/1999 | Smith .................... | G10H 7/006 84/627 |
| 6,647,359 B1 * | 11/2003 | Verplank et al. ................. | 703/2 |
| 6,760,050 B1 | 7/2004 | Nakagawa | |
| 7,027,600 B1 | 4/2006 | Kaji | |
| 7,330,769 B2 | 2/2008 | Comair | |
| 2003/0045956 A1 | 3/2003 | Comair | |
| 2007/0196801 A1 * | 8/2007 | Nagasaka .............. | G09B 23/28 434/262 |

(Continued)

OTHER PUBLICATIONS

Aramaki et al, imagine the sound, an intuitive control of an impact sound synthesizer, 2010.*

(Continued)

*Primary Examiner* — Davetta W Goins
*Assistant Examiner* — Kuassi Ganmavo
(74) *Attorney, Agent, or Firm* — Jennifer R. Davis; Otterstedt, Ellenbogen & Kammer, LLP (57) ABSTRACT

Disclosed are a method and apparatus for producing sounds in a virtual world, as well as a sound card. The method comprises the steps of determining a spring mass model of an object in the virtual world based on a 3D model of the object; analyzing force components produced on the 3D model by a collision in the virtual world; and generating sounds produced by the collision according to the spring mass model and the force components. By considering sound material of the object in the virtual world, the method, apparatus, and sound card may produce sounds in the virtual world more vividly and in real time.

20 Claims, 6 Drawing Sheets

(56) References Cited

U.S. PATENT DOCUMENTS

| | | | |
|---|---|---|---|
| 2007/0239409 A1* | 10/2007 | Alan | ................................. 703/2 |
| 2009/0015583 A1* | 1/2009 | Starr | ..................... G06T 13/205 345/419 |
| 2010/0197401 A1 | 8/2010 | Altshuler | |
| 2011/0074772 A1* | 3/2011 | Wada et al. | ................... 345/419 |

OTHER PUBLICATIONS

Llyod et al, Identification of spring parameters for deformable object simulation,ieee,2007.*
Picard, Expressive sound synthesis for animation, 2009.*
Raghuvanshi et al, Interactive sound synthesis for large scale environment,2006.*
Ren et al, Synthesizing contact sound between textures model,2010.*
O'Brien et al, Synthesizing Sounds from Rigid-Body Simulations, ACM, 2002.*
Manocha, Interactive Sound Rendering, 2009.*
Avanzini, Integrating Physically based sound models in a multimodal rendering architecture,2006.*
Kees van den Doel,, et al. "Foleyautomatic:Physically-based Sound Effects for Interactive Simulation and Animation." To appear in SIGGRAPH 2001 Conference Proceedings.
"Geforce", downloaded from http://www.geforce.com/Hardware/Technologies/physx Feb. 21, 2012.
"Nvidia" downloaded from http://en.wikipedia.org/wiki/Nvidia Feb. 21, 2012.
Nikunj Raghuvanshi et al, "Interactive Sound Synthesis for Large Scale Environments". Redwood City, California, Mar. 14-17, 2006.
David C. Brogan et al,"Dynamically Simulated Characters in Virtual Environments". Sep./Oct. 1998, IEEE.
Sun Wei et al,"Sound Design in Simulative System of Educational Robot". Computer Engineering, vol. 35, No. 9, May, 2009.
D. Bommes et al., "Mixed-Integer Quadrangulation," Proceedings of ACM SIGGRAPH 2009, Transactions on Graphics (TOG), vol. 28, No. 3, Article 77, 10 pages, Aug. 2009.
J. F. O'Brien & J. K. Hodgins, "Graphical Modeling and Animation of Brittle Fracture," Proceedings of SIGGRAPH '99, pp. 137-146, 1999.
J. F. O'Brien et al., "Synthesizing Sounds from Rigid-Body Simulations," Proceedings of the 2002 ACM SIGGRAPH/Eurographics Symposium on Computer Animation (SCA '02), pp. 175-181 and 203, 2002.
J. F. O'Brien et al., "Synthesizing Sounds from Physically Based Motion," Proceedings of ACM SIGGRAPH 2001, pp. 529-536, Aug. 2001.
D. Terzopoulos & K. Fleischer, "Deformable Models," The Visual Computer, vol. 4, No. 6, pp. 306-331, Nov. 1988.

* cited by examiner

PRODUCING SOUNDS IN A VIRTUAL WORLD AND RELATED SOUND CARD

CROSS-REFERENCE TO RELATED APPLICATION(S)

This application claims foreign priority to P.R. China Patent application 201110051604.5 filed 28 Feb. 2011, the complete disclosure of which is expressly incorporated herein by reference in its entirety for all purposes.

TECHNICAL FIELD

Embodiments of the present invention relate to a virtual world, and more specifically, to a method and apparatus for producing sounds in the virtual world, as well as a sound card.

BACKGROUND

In the field of virtual world, there are various methods of simulating sounds that were produced based on collision. For example, the technical solution of U.S. Patent Application Publication No. 2007/0196801 can calculate and generate a sound wave according to the physical movement collision between objects, and then synthesize a plurality of sound waves to simulate sounds produced by the collision. For another example, the technical solution of U.S. Patent Application Publication No. 2010/0197401 describes collecting sounds at a plurality of points in a three-dimensional scenario and calculating a sound source in real time according to the collected sounds in the process of three-dimensional scenario simulation. In addition, the technical solution of U.S. Pat. No. 7,330,769 discloses that sounds may be synthesized and simulated in application scenarios of the virtual world such as games according to a set of preset sound wave models, wherein the pitches and volumes of the set of sound wave models are controllable.

With increasingly prevalent application of the virtual world, it is desirable to obtain more vivid and real-time sounds in the virtual world. However, existing solutions for producing sounds in the virtual world are more or less unsatisfactory. For example, the technical solution of U.S. Patent Application Publication No. 2007/0196801 does not consider the impact of sound material of an object on sound simulation and hence fails to produce sounds in the virtual world more vividly. The technical solution of U.S. Patent Application Publication No. 2010/0197401 collects fixed sounds and hence fails to accomplish real-time sound synthesis. Furthermore, the technical solution disclosed in U.S. Pat. No. 7,730,769 performs simulation by synthesizing preset sounds, instead of by using attributes of objects in the virtual world.

SUMMARY

Therefore, currently a need exists for a technical solution that is capable of producing sounds in the virtual world vividly and in real time.

In view of the above problems, embodiments of the present invention provide a method and apparatus for producing sounds in the virtual world, as well as a sound card.

According to a first aspect of embodiments of the present invention, there is provided a method of producing sounds in a virtual world. The method may comprise the steps of: determining a spring mass model of an object in the virtual world based on a 3D model of the object; analyzing force components produced on the 3D model by a collision in the virtual world; and generating sounds produced by the collision according to the spring mass model and the force components.

According to a second aspect of embodiments of the present invention, there is provided an apparatus for producing sounds in a virtual world. The apparatus may comprise: determining means configured to determine a spring mass model of an object in the virtual world based on a 3D model of the object; analyzing means configured to analyze force components produced on the 3D model by a collision in the virtual world; and generating means configured to generate sounds produced by the collision according to the spring mass model and the force components.

According to a third aspect of embodiments of the present invention, there is provided a sound card. The sound card may comprise: a processor configured to determine a spring mass model of an object in a virtual world based on a 3D model of the object, analyze force components produced on the 3D model by a collision in the virtual world, and generate sounds produced by the collision according to the spring mass model and the force components.

By considering sound material of the object in the virtual world, the method, apparatus, and sound card may produce sounds in the virtual world more vividly and in real time.

Other features and advantages of embodiments of the present invention will become more apparent from the following description of embodiments that illustrate principles of the present invention, when taken in conjunction with the figures.

BRIEF DESCRIPTION OF THE DRAWINGS

As the present invention is apprehended more thoroughly, other objects and effects of the present invention will become more apparent and easier to understand by means of the following description with reference to the accompanying drawings, wherein.

Like numerals represent the same, similar or corresponding features or functions throughout the figures.

DETAILED DESCRIPTION

More detailed description will be presented below to embodiments of the present invention by referring to the figures. It is to be understood that the figures and embodiments of the present invention are merely for illustration, rather than limiting the protection scope of the present invention.

The flowcharts and block diagrams in the figures illustrate the system, methods, as well as architecture, functions and operations executable by a computer program product according to various embodiments of the present invention. In this regard, each block in the flowcharts or block diagrams may represent a module, a program segment, or a part of code, which contains one or more executable instructions for performing specified logic functions. It should be noted that in some alternative implementations, functions indicated in blocks may occur in an order differing from the order as shown in the figures. For example, two blocks shown consecutively may be performed in parallel substantially or in an inverse order sometimes, which depends on the functions involved. It should be further noted that each block and a combination of blocks in the block diagrams or flowcharts may be implemented by a dedicated, hardware-based system for performing specified functions or operations or by a combination of dedicated hardware and computer instructions.

Technical terms used in embodiments of the present invention are first explained for a purpose of clarity.

1. Virtual World

The term "virtual world" used in embodiments of the present invention relates to enabling players to experience and interact with a virtual world by means of various vivid, three-dimensional feelings such as sight, hearing, and touch produced by a computer. In the virtual world, a three-dimensional space with several objects may be generated by means of a computer so that players feel as if they were present in the three-dimensional space.

2. 3D Model

Figure 4A:
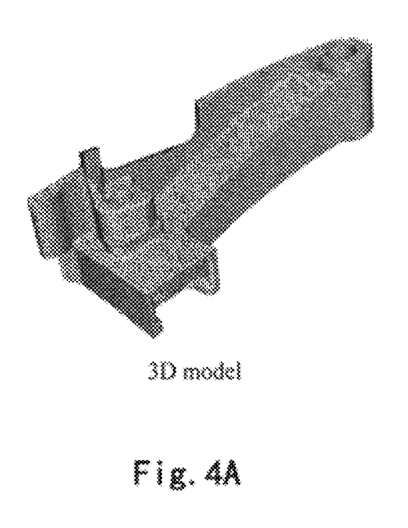
FIG. 4A is a schematic view of a 3D model in the virtual world according to one embodiment of the present invention.

An object in the virtual world corresponds to one 3D model. A 3D model may be described in two manners, one of which is a continuous model and the other of which is a discrete model. The continuous model defines curves/surfaces of an object by a mathematical function, such as splines, Bezier curves/surfaces, etc. The discrete model is usually described with triangular meshes or quadrangular meshes. A triangular mesh model may be translated into a quadrangular mesh model (refer to the document "Mixed-Integer Quadrangulation," David Bommes, Henrik Zimmer, Leif Kobbelt ACM Transactions on Graphics (TOG), 28(3), Article No. 77, 2009 Proceedings of the 2009 SIGGRAPH Conference). FIG. 4A illustrates a schematic view of a 3D model in the virtual world that is described by triangular meshes.

3. Spring Mass Model

Figure 4B:
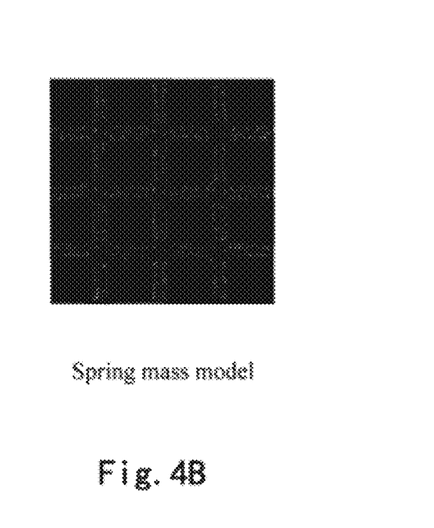
FIG. 4B is a schematic view of a spring mass model in the virtual world according to one embodiment of the present invention.

A spring mass model may be simplified as a structure of a square grid formed by springs and particles, each edge of the square being a spring, and each vertex of the square being a particle. FIG. 4B illustrates a schematic view of a spring mass model according to one embodiment of the present invention. Each particle in the spring mass model corresponds to each vertex in the 3D model, and each particle in the spring mass model may be determined according to each vertex in the 3D model, and vice versa.

The spring mass model may characterize attributes of an object and reflect material of the object. Each particle in the spring mass model may have its own mass, stiffness coefficient, and damp coefficient, all of which may be used to characterize attributes (such as weight, stiffness, etc.) of an object and reflect material of the object. A mass of a particle may represent a weight of the particle; a stiffness coefficient of a particle may represent a stiffness magnitude of the particle; and a damp coefficient of a particle may reflect a physical attribute of an object, which depends on concrete material of the object.

In one embodiment, there is described a method of producing sounds in the virtual world. In this embodiment, first, a spring mass model of an object may be determined based on a 3D model of the object in the virtual world, so that at least one of a mass, stiffness coefficient, and damp coefficient of a particle in the spring mass model may be further obtained; then, force components produced on the 3D model by a collision in the virtual world may be analyzed. For example, it is possible to obtain at least one of a transient contact force component and a friction force component produced by the collision on the 3D model; afterwards, sounds produced in the virtual world are generated according to the determined spring mass model and the obtained force components.

Figure 1:
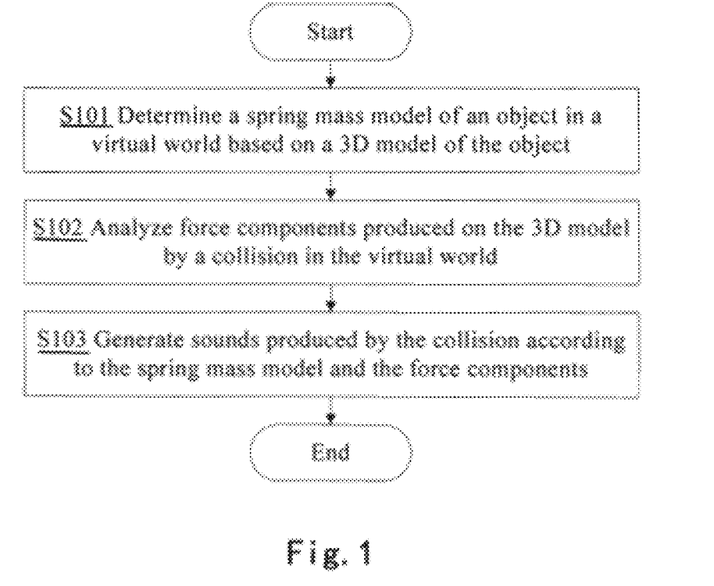
FIG. 1 is a flowchart of a method of producing sounds in the virtual world according to one embodiment of the present invention.

FIG. 1 is a flowchart of a method of producing sounds in the virtual world according to one embodiment of the present invention.

In step S101, a spring mass model of an object in the virtual world is determined based on a 3D model of the object.

As described above, a spring mass model may characterize attributes of an object and reflect material of the object. Since each vertex in a 3D model of an object corresponds to each particle in a spring mass model of the object, a particle in a corresponding spring mass model may be determined according to a known 3D model (e.g., a triangular mesh model). Then, it is possible to obtain at least one of a mass, a stiffness coefficient, and a damp coefficient of the particle in the spring mass model of the object.

For example, it is possible to calculate a mass of a particle in a spring mass model of an object according to a mass of a 3D model of the object and the number of particles in the spring mass model. For example, a stiffness coefficient of a particle in a spring mass model may be calculated according to a unit-area stiffness coefficient preset for the spring mass model and an area of the particle in the spring mass model. For another example, a user inputted value may be received as a damp coefficient of a particle in a spring mass model. In addition, a preset value may be received as a damp coefficient of a particle in a spring mass model. Detailed description will be presented below to manners of obtaining a mass, stiffness coefficient, and damp coefficient of a particle in the context of an embodiment illustrated in FIG. 2.

In step S102, force components produced on the 3D model by a collision in the virtual world are analyzed.

The prior art has proposed some methods for analyzing force components produced by a collision. For example, it is possible to select a research object, i.e., an object on which force analysis will be performed. Since a collision might occur between two objects in the virtual world, one of these two objects may be selected as the object to be subjected to force analysis. Then, the research object may be isolated from surrounding objects. Subsequently, force analysis may be performed in a certain order. For example, gravity may be analyzed first; objects contacting the research object are found around the research object, and they are subjected to analysis of elastic force and friction force one by one: and finally other field forces may be analyzed.

In embodiments of the present invention, research mainly focuses on sounds produced by a collision between two objects. For a first one of these two objects, it produces sounds due to collision between these two objects; likewise, a second one of these two objects produces sounds due to collision. Hence, in embodiments of the present invention, research is only directed to sounds produced by the first object due to the collision. For sounds produced by the second object due to the collision, they may be obtained likewise by the method of the present invention and are not detailed here. In embodiments of the virtual world, these two kinds of sounds may be composed so as to form more vivid sounds.

Figure 5:
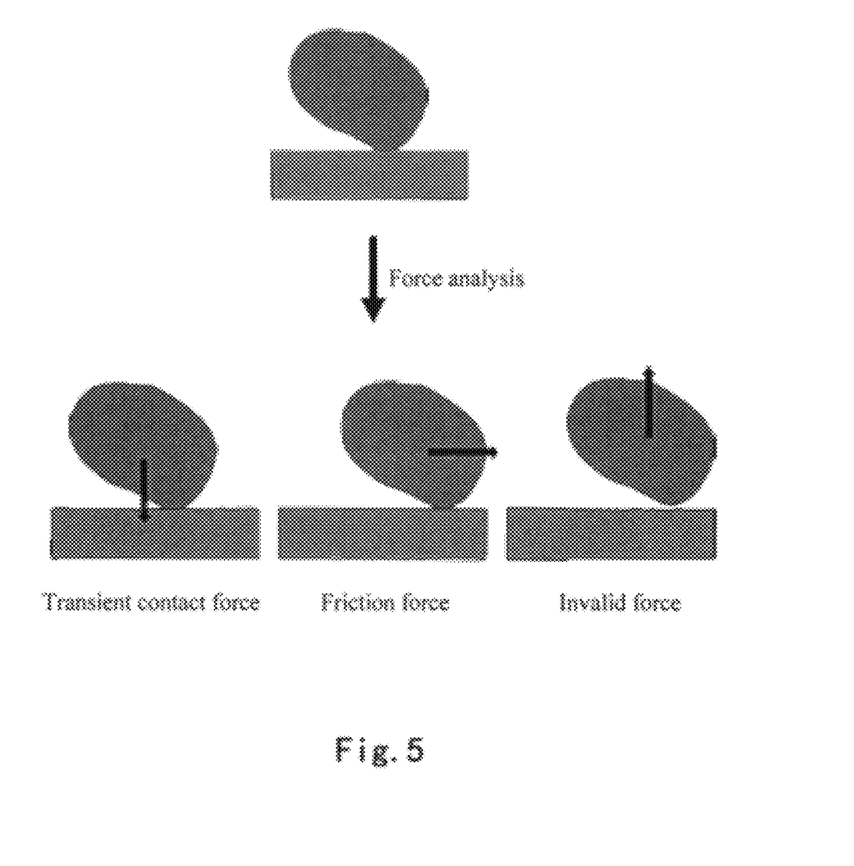
FIG. 5 is a schematic view of performing force analysis on the 3D model in the virtual world according to one embodiment of the present invention.

Force analysis may be performed on the 3D model in step S102, so as to obtain at least one of a transient contact force component and a friction force component produced on the 3D model by a collision. As illustrated in FIG. 5, by performing force analysis on the 3D model, it is possible to obtain a transient contact force in a downward direction, a friction force in a forward direction, and an invalid force in an upward direction. The transient contact force, the friction force, and the invalid force are all force components produced on the 3D model on collision. Since the invalid force makes no contribution to sounds produced by a collision, it is not considered in embodiments of the present invention. Both the transient contact force component (hereinafter referred to as the transient contact force in short) and the friction force component (hereinafter referred to as the friction force in short) are vectors each having a magnitude and direction. For the sake of simplicity, FIG. 5 merely illustrates directions of the transient contact force and/or friction force but does not illustrate magnitude of the transient contact force and/or friction force, which may be obtained by those skilled in the art by using existing methods and techniques.

In step S103, sounds produced by the collision are generated according to the spring mass model and the force components.

In one embodiment, a sound source may be generated using the spring mass model obtained in step S101 and the force components obtained in step S102. Subsequently, the generated sound source may be further processed. For example, it may be filtered. Since a frequency suitable for human hearing ranges between 20 Hz and 20 kHz, the generated sound source may be bandpass-filtered to remove signals that make no contribution or a little contribution to human hearing. Afterwards, the filtered sound source may be attenuated; then, the attenuated sound source may be mixed with other sound sources caused by the collision, so as to generate sounds produced by the collision.

In another embodiment, before the sound source is generated according to the spring mass model and the force components, the spring mass model obtained in step S101 may be clipped according to the force component obtained in step S102. The purpose of clipping is to remove from the spring mass model particles that make a little contribution to the generation of a sound source, but retain in the clipped spring mass model particles that make a larger contribution. Then, a sound source may be generated based on the clipped spring mass model and the force components; the sound source may be filtered; the filtered sound source may be then attenuated; and finally the attenuated sound source may be mixed with other sound sources caused by the collision.

Finally, the flow of FIG. 1 ends.

Figure 2:
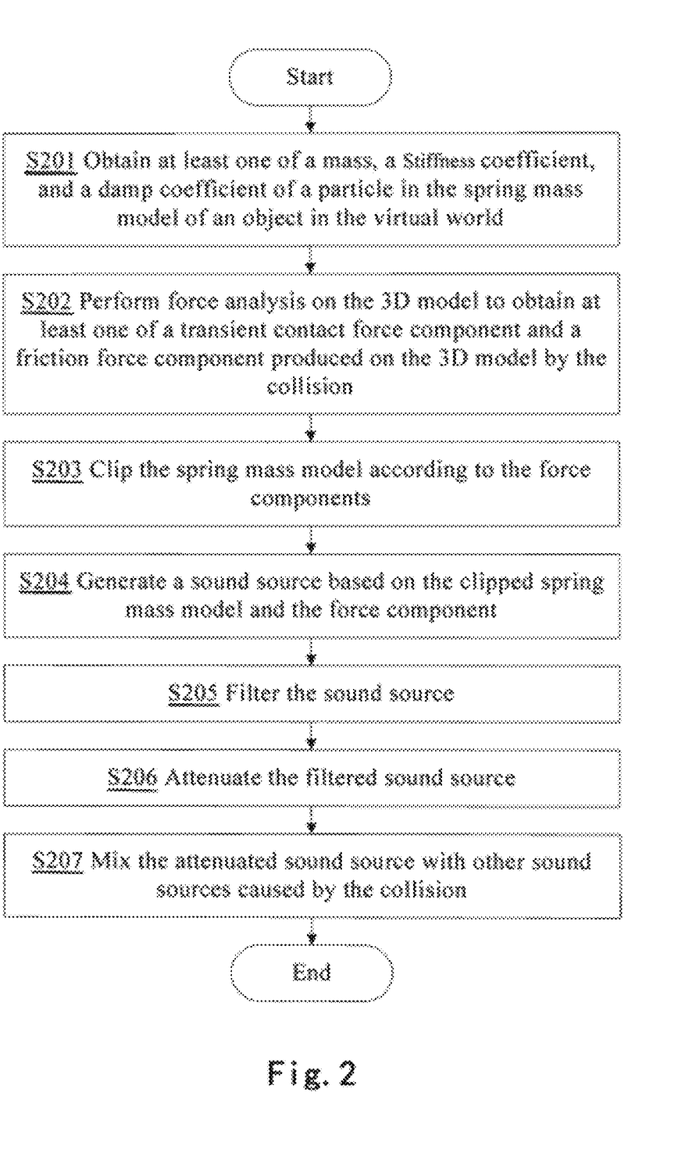
FIG. 2 is a flowchart of a method of producing sounds in the virtual world according to another embodiment of the present invention.

FIG. 2 is a flowchart of a method of producing sounds in the virtual world according to another embodiment of the present invention.

In step S201, at least one of a mass, stiffness coefficient, and damp coefficient of a particle in a spring mass model of an object in the virtual world is obtained.

The mass of the particle in the spring mass model of the object may be obtained in various manners. For example, it is possible to obtain a mass of a 3D model, determine the number of vertexes in the 3D model as the number of particles in the spring mass model, and calculate a mass of each particle in the spring mass model according to the mass of the 3D model and the number of particles in the spring mass model.

Also, the stiffness coefficient of the particle in the spring mass model of the object may be obtained in various manners. For example, it is possible to obtain an average length of adjacent edges of each vertex in a 3D model, calculate an area according to the average length of the adjacent edges as an area of each particle in the spring mass model, and calculate the stiffness coefficient of each particle in the spring mass model according to a preset unit-area stiffness coefficient and the area of each particle in the spring mass model.

The damp coefficient of the particle in the spring mass model of the object may be obtained in various manners. For example, a user inputted value or a preset value may be received as the damp coefficient of each particle in the spring mass model.

In one embodiment, assume that the user uses a model editing tool and during a modeling phase, inputs a unit-volume mass M' of the 3D model, a unit-area stiffness value K', and a damp coefficient C' of the 3D model. Since a damp coefficient is irrelevant to a volume and area of an object, the damp coefficient C' of the 3D model as input by the user may be used as the damp coefficient C of each particle in the spring mass model.

In this embodiment, assume that all particles in the spring mass model have an equal area and volume. Then, the mass M of each particle in the spring mass model may be calculated through the following steps: first, calculating the volume V of the 3D model, then calculating the mass V×M' of the entire 3D model according to the volume V and the unit-volume mass M', and calculating the mass of each particle through equation (1) according to the number N of particles in the spring mass model:

$$M = M' \times V / N \quad (1)$$

In this embodiment, assume that in the 3D model the $i^{th}$ vertex is connected with $X_i$ other vertexes, wherein i=1, 2, ... N, N is the number of vertexes in the 3D model and also the number of particles in the spring mass model. Respective lengths of $X_i$ adjacent edges of the $i^{th}$ vertex are calculated as $L_i$, and then an average length of adjacent edges of the $i^{th}$ vertex may be obtained as:

$$L_i^{ava} = \sum_{i=1}^{N} L_i / X_i \quad (2)$$

In this embodiment, an area of each particle in the spring mass model may be obtained using the average length of the adjacent edges. For example, a circular area may be calculated as an area of the $i^{th}$ particle in the spring mass model by taking the average length of the adjacent edges or a certain percentage thereof (for example, a half of the average length of the adjacent edges) as a radius and taking a location of the $i^{th}$ particle as a circular center; or, a square area may be calculated as an area of the $i^{th}$ particle in the spring mass model by taking the average length of the adjacent edges or a certain percentage thereof (for example, a half of the average length of the adjacent edges) as an edge length and taking a location of the $i^{th}$ particle as a center; or, an area of any shape may be calculated as an area of the $i^{th}$ particle in the spring mass model according to the average length of the adjacent edges or a certain percentage thereof and a location of the $i^{th}$ particle.

After the area of each particle in the spring mass model is obtained, a stiffness coefficient of each particle may be obtained according to the unit-area stiffness value K' of the spring mass model. For example, the stiffness coefficient of each particle may be obtained by multiplying the area of each particle by the unit-area stiffness value K'; or, the stiffness coefficient of each particle may be obtained by multiplying the unit-area stiffness value K' by areas of different particles that have been weighted with a predetermined weighting factor.

In step S202, force analysis is performed on the 3D model to obtain at least one of a transient contact force component and a friction force component produced on the 3D model by the collision.

This step is similar to step S102. As illustrated in FIG. 5, by performing force analysis on the 3D model, it is possible to obtain a transient contact force in a downward direction and a friction force in a forward direction. The transient contact force and the friction force are both force components produced on the 3D model on collision, and they both are vectors each having a magnitude and direction.

In step S203, the spring mass model is clipped according to the force component.

In the embodiment illustrated in FIG. 2, before the spring mass model and the force component generate a sound source, the spring mass model may be clipped according to the force component obtained in step S202. The purpose of clipping is to remove from the spring mass model particles that make a little contribution to the generation of a sound source, but retain in the clipped spring mass model particles that make a larger contribution, so as to generate a sound source based on the clipped spring mass model and the force component. In one embodiment, it is possible to obtain force components on each respective vertex in the 3D model that corresponds to each particle in the spring mass model; and, if one or more force components of a vertex are less than a corresponding predetermined threshold, then a particle corresponding to this vertex is removed from the spring mass model.

The clipping process of the spring mass model is model simplification performed according to the force component (e.g., the friction force and/or the transient contact force).

For friction force on a vertex in the 3D model, it may be compared with a predetermined threshold for friction force. The predetermined threshold may be obtained based on experience, may be preset, or may be obtained by those skilled in the art in a proper manner. The comparison may be made in various manners. For example, for a vector force, such as a friction force, a mod operation may be performed to obtain a scalar and the scalar can be compared. If the friction force is less than the predetermined threshold, a particle corresponding to this vertex is then removed from the spring mass model, i.e., such kind of particles in the spring mass model are omitted in subsequent calculation of a sound source by using the spring mass model, but particles other than such kind of particles in the spring mass model are used for determining a sound source subsequently and accomplishing sound simulation. In this way, the computation load is reduced significantly, while the efficiency is improved.

In another embodiment, in the process of determining a sound source by using particles other than such kind of particles in the spring mass model, i.e., vertexes whose friction forces are more than the predetermined threshold, a physical engine (e.g., the NVIDIA® PhysX® technique available from NVIDIA CORPORATION, SANTA CLARA, CALIF., USA, which can be used for increasing reality elements in a game) may obtain a set of contact vertexes, contact edges, and contact faces where the object that is being processed collides with other objects. According to some methods or algorithms that are known to those skilled in the art, a contact edge may be translated into two contact vertexes, and a contact face into three contact vertexes. In this way, the contact set for the colliding object may be translated into a set of contact vertexes. Then, particles corresponding to respective vertexes in the set of contact vertexes may be determined according to the correspondence relationship between vertexes in the 3D model and particles in the spring mass model, and further a set of contact particles may be determined. Subsequently, a sound source is determined using particles other than such kind of particles in the spring mass model, and finally sound simulation is accomplished. In this manner, the computation load is reduced significantly, with the efficiency being improved.

For transient contact force on a vertex in the 3D model, it may be calculated with reference to the document "O'BRIEN. J. F., AND HODGINS, J. K. 1999. Graphical modeling and animation of brittle fracture. In Proceedings of SIGGRAPH 99, Computer Graphics Proceedings, Annual Conference Series, 137-146." Next, respective vertexes in the 3D model are traversed, and transient contact force on each vertex is compared with a predetermined threshold for transient contact force. The predetermined threshold may be obtained based on experience, may be preset, or may be obtained by those skilled in the art in a proper manner. The comparison may be made in various manners. For example, for a vector force, such as a friction force, a mod operation may be performed to obtain a scalar and the scalar can be compared. If the friction force is less than the predetermined threshold, a particle corresponding to this vertex is then removed from the spring mass model, i.e., such kind of particles in the spring mass model are omitted in subsequent calculation of a sound source by using the spring mass model, in order to reduce the computation load and improve the efficiency.

In respective embodiments of the present invention, the spring mass model may be clipped by removing particles whose friction force is less than a predetermined threshold for friction force, by removing particles whose transient contact force is less than a predetermined threshold for transient contact force, or by removing particles whose friction force is less than a predetermined threshold for friction force and whose transient contact force is less than a predetermined threshold for transient contact force.

It should be noted that in embodiments of the present invention, step S203 in which the spring mass model is clipped is optional. That is, steps S204 to S207 may be performed directly based on the result of step S201 without the clipping process of step S203.

In step S204, a sound source is generated based on the clipped spring mass model and the force component.

The sound source may be generated in various manners. For example, the following the equation of dynamic response analysis for an object may be used for generating the sound source according to the spring mass model and the force component (for details, please refer to the document J. F. O'Brien, C. Shen, and C. M. Gatchalian. Synthesizing sounds from rigid-body simulations. In SCA '02: Proceedings of the 2002 ACM SIGGRAPH/Eurographics symposium on Computer animation, pages 175-181, ACM, 2002, which is incorporated here for reference).

$$M\frac{d^2r}{dt^2} + C\frac{dr}{dt} + Kr = f \quad (3)$$

In the above equation, assume that one object consists of N particles, then masses of respective particles in the spring mass model may form an N-dimensional vector "M," wherein each element of the vector represents a mass of each particle; "C" may also be an N-dimensional vector, wherein each element of the vector represents a damp coefficient of each particle; "K" may be an N-dimensional vector, wherein each element of the vector represents a stiffness coefficient of each particle; "r" may be an N-dimensional vector too, wherein each element of the vector represents a shift value of each particle; "f" represents force on the object due to the collision, which force may be the friction force component and/or the transient contact force component obtained in step S202.

It is possible to replace at least one of "M," "K," and "C" in equation (3) with at least one of the mass, stiffness coefficient, and damp coefficient of the particle in the spring mass model of the object as obtained in step S201. For example, when the mass of the particle is obtained in step S201, "M" in equation (3) may be replaced with the obtained mass, and "K" and "C" in equation (3) may use empiric values of those skilled in the art or any proper preset values.

According to the clipped spring mass model obtained in step S203 and the force component obtained in step S202, a vibration equation (4) may be obtained by solving equation (3), wherein w, in equation (5) is an angular velocity value that can be translated into a corresponding frequency value.

$$z_i(t) = c_i e^{\omega_i^+ t} + \overline{c}_i e^{\omega_i^- t} \quad (4)$$

$$\omega_i^\pm = \frac{-(\gamma\lambda_i + \eta) \pm \sqrt{(\gamma\lambda_i + \eta)^2 - 4\lambda_i}}{2} \quad (5)$$

In another embodiment of the present invention, Rayleigh damp coefficients may be used in transient dynamics analysis and "C" in equation (3) may be replaced with the following equation:

$$C = \alpha * M + \beta * K \quad (6)$$

Wherein the damp coefficient is replaced with two Rayleigh damp coefficients, namely α and β, and the user may input these two values during modeling to represent the damp coefficient of the object.

By substituting equation (6) into equation (3), it is possible to obtain another equation of dynamics response analysis for generating a sound source:

$$M\frac{d^2r}{dt^2} + (\alpha \cdot M + \beta \cdot K)\frac{dr}{dt} + K \cdot r = f \quad (7)$$

By solving the ordinary differential equation shown in equation (7), it is also possible to obtain a vibration equation and an angular velocity value that are similar to equation (4) and equation (5), respectively.

In addition, it is possible to generate a sound source based on the spring mass model and the force component by other methods or approaches that are known to those skilled in the art. Equations (3) and (7) of dynamics response analysis as shown in embodiments of the present invention are merely two specific implementations for generating a sound source based on the spring mass model and the force component; however, manners of generating a sound source based on the spring mass model and the force component should not be limited thereto.

In step S205, the sound source is filtered.

Generally speaking, a sound frequency suitable for human hearing ranges between around 20 Hz and around 20 kHz. The generated sound source may be filtered accordingly, for example, by a bandpass filter to remove signals that make no contribution or little contribution to human hearing.

In step S206, the filtered sound source is attenuated.

According to a specific environment in the virtual world, it is possible to reflect, interfere, diffract, and refract the obtained sound source. In addition, the attenuation of the sound source may be achieved, by various known methods and techniques in the art and should not be limited to specific manners as disclosed in embodiments of the present invention.

In step S207, the attenuated sound source is mixed with other sound sources caused by the collision.

In embodiments of the present invention, research mainly focuses on sounds produced by the collision between two objects. For a first one of these two objects, it produces sounds clue to collision between these two objects: likewise, a second one of these two objects produces sounds due to collision. Hence, sounds produced by the first object due to collision may be obtained according to step S201 to step S206; likewise, sounds produced by the second object due to collision may be obtained according to the method of the present invention. In step S207, these two kinds of sounds may be composed. For example, an amplitude and phase of a sound source signal indicative of sounds of the first object may be composed with an amplitude and phase of a sound source signal indicative of sounds of the second object, respectively, whereby more vivid sounds are formed.

Finally, the flow of FIG. 2 ends.

Figure 3:
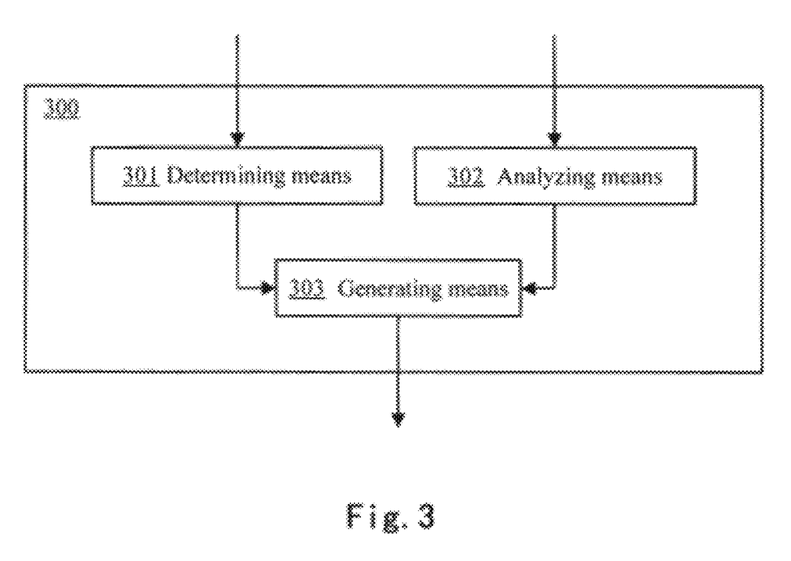
FIG. 3 is a block diagram of an apparatus for producing sounds in the virtual world according to one embodiment of the present invention.

FIG. 3 is a block diagram of an apparatus for producing sounds in the virtual world according to one embodiment of the present invention. An apparatus 300 illustrated in FIG. 3 may comprise determining means 301, analyzing means 302, and generating means 303.

The determining means 301 may be configured to determine a spring mass model of an object in the virtual world based on a 3D model of the object.

In one embodiment, the determining means 301 may comprise an obtaining unit. The obtaining unit may be configured to obtain at least one of a mass, stiffness coefficient, and damp coefficient of a particle in the spring mass model of the object. In one embodiment of the present invention, the obtaining unit may comprise: means for obtaining a mass of the 3D model; means for determining the number of vertexes in the 3D model as the number of particles in the spring mass model; and means for calculating the mass of the particle in the spring mass model according to the mass of the 3D model and the number of particles in the spring mass model. In another embodiment of the present invention, the obtaining unit may comprise: means for obtaining an average length of adjacent edges of a vertex in the 3D model; means for calculating an area according to the average length of the adjacent edges, as an area of the particle in the spring mass model; and means for calculating the stiffness coefficient of the particle in the spring mass model according to a preset unit-area stiffness coefficient and the area of the particle in the spring mass model. In a further embodiment of the present invention, the obtaining unit may comprise means for receiving a user inputted value or a preset value as the damp coefficient of the particle in the spring mass model.

The analyzing means 302 may be configured to analyze force components produced on the 3D model by a collision in the virtual world. In one embodiment, the analyzing means 302 may comprise means for performing force analysis on the 3D model to obtain at least one of a transient contact force component and a friction force component produced on the 3D model by the collision.

The generating means 303 may be configured to generate sounds produced by the collision, according to the spring mass model and the force components. In one embodiment, the generating means 303 may comprise: means for clipping the spring mass model according to the force components; means for generating a sound source based on the clipped spring mass model and the force components; means for filtering the sound source; means for attenuating the filtered sound source; and means for mixing the attenuated sound source with other sound sources caused by the collision. In one example of the present invention, the means for clipping the spring mass model according to the force components may comprise: means for obtaining force components on each vertex in the 3D model that corresponds to each particle in the spring mass model; and means for, if one or more force components on an vertex are less than a corresponding predetermined threshold, removing from the spring mass model a particle that corresponds to this vertex.

Embodiments of the present invention further disclose a sound card, which is for producing sounds in the virtual world. The sound card according to embodiments of the present invention may comprise: a processor comprising an apparatus for producing sounds in the virtual world according to any one of claims 9 to 16; a filter configured to filter a sound source generated by the processor; an attenuator configured to attenuate the filtered sound source; and a mixer configured to mix the attenuated sound source with other sound sources caused by the collision.

Figure 6:
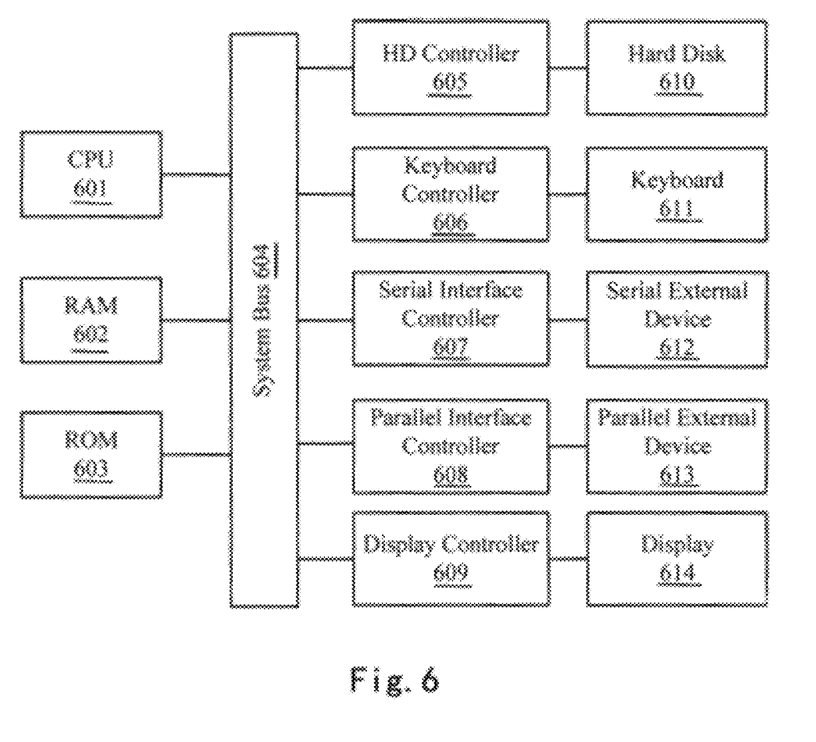
FIG. 6 is structural block diagram of a computer system in which the present invention may be implemented.

FIG. 6 schematically illustrates a structural block diagram of a computing apparatus in which embodiments according to the present invention may be implemented.

A computer system as illustrated in FIG. 6 comprises a CPU (central processing unit) 601, RAM (random access memory) 602, ROM (read only memory) 603, a system bus 604, a hard disk controller 605, a keyboard controller 606, a serial interface controller 607, a parallel interface controller 608, a display controller 609, a hard disk 610, a keyboard 611, a serial external device 612, a parallel external device 613 and a display 614. Among these components, the CPU 601, the RAM 602, the ROM 603, the hard disk controller 605, the keyboard controller 606, the serial interface controller 607, the parallel interface controller 608, and the display controller 609 are connected to the system bus 604; the hard disk 610 is connected to the hard disk controller 605; the keyboard 611 is connected to the keyboard controller 606; the serial external device 612 is connected to the serial interface controller 607; the parallel external device 613 is connected to the serial interface controller 608; and the display 614 is connected to the display controller 609.

The function of each component in FIG. 6 is publicly known in this technical field, and the structure as shown in FIG. 6 is conventional. In different applications, some components can be added to the structure shown in FIG. 6, or some components shown in FIG. 6 can be omitted. The whole system shown in FIG. 6 is controlled by computer readable instructions usually stored in the hard disk 610 as software, or stored in EPROM or other nonvolatile memories. The software can be downloaded from the network (not shown in the figure). The software stored in the hard disk 810 or downloaded from the network can be uploaded to RAM 602 and executed by the CPU 601 to perform functions determined by the software.

Although the computer system as described in FIG. 6 can support the apparatus for producing sounds in the virtual world according to embodiments of the present invention, it is merely one example of a computer system. Those skilled in the art would readily appreciate that many other computer system designs can also realize embodiments of the present invention.

The present invention further relates to a computer program product, which includes code for: determining a spring mass model of an object in a virtual world based on a 3D model of the object; analyzing force components produced on the 3D model by a collision in the virtual world; and generating sounds produced by the collision according to the spring mass model and the force components. Before use, the code can be stored in a memory of other computer system, for example, stored in a hard disk or a removable memory such as a CD or a floppy disk, or downloaded via the Internet or other computer networks.

The methods as disclosed in the present invention can be implemented in software, hardware or combination of software and hardware. The hardware portion can be implemented by using dedicated logic; the software portion can be stored in a memory and executed by an appropriate instruction executing system such as a microprocessor, a personal computer (PC) or a mainframe computer. In one embodiment, the present invention is implemented as software, including, without limitation to, firmware, resident software, micro-code, etc.

Moreover, the present invention may be implemented as a computer program product used by computers or accessible by computer-readable media that provide program code for use by or in connection with a computer or any instruction executing system. For the purpose of description, a computer-usable or computer-readable medium may be any tangible means that can contain, store, communicate, propagate, or transport the program for use by or in connection with an instruction execution system, apparatus, or device.

The medium may be an electric, magnetic, optical, electromagnetic, infrared, or semiconductor system (apparatus or device), or propagation medium. Examples of the computer-readable medium would include the following: a semiconductor or solid storage device, a magnetic tape, a portable computer diskette, a random access memory (RAM), a read-only memory (ROM), a hard disk, and an optical disk. Examples of the current optical disk include a compact disk read-only memory (CD-ROM), compact disk-read/write (CD-R/W), and DVD.

A system adapted for storing and/or executing program code according to embodiment of the present invention would include at least one processor that is coupled to a memory element directly or via a system bus. The memory element may include a local memory usable during actually executing the program code, a mass memory, and a cache that pros ides temporary storage for at least one portion of program code so as to decrease the number of times for retrieving code from the mass memory during execution.

An Input/Output or I/O device (including, without limitation to, a keyboard, a display, a pointing device, etc.) may be coupled to the system directly or via an intermediate I/O controller.

A network adapter may also be coupled to the system such that the data processing system can be coupled to other data processing systems, remote printers or storage devices via an intermediate private or public network. A modem, a cable modem, and an Ethernet card are merely examples of a currently available network adapter.

It should be noted that some more specific technical details that are publicly known to those skilled in the art and that might be essential to the implementation of the present invention are omitted in the above description in order to make the present invention more easily understood.

The specification of the present invention has been presented for purposes of illustration and description, and is not intended to be exhaustive or limited to the invention in the form disclosed. Many modifications and variations will be apparent to those of ordinary skill in the art.

Therefore, the embodiments were chosen and described in order to best explain the principles of the invention and the practical application, and to enable others of ordinary skill in the art to understand that all modifications and alterations made without departing from the spirit of the present invention fall into the protection scope of the present invention as defined in the appended claims.

What is claimed is:

1. A method of producing sounds in a virtual world, comprising:
    determining a spring mass model of an object in the virtual world based on a 3D model of the object;
    calculating force components produced on the 3D model by a collision in the virtual world; and
    generating sounds produced by the collision according to the spring mass model and the force components;
    wherein calculating the force components produced on the 3D model by the collision in the virtual world comprises performing force analysis on the 3D model; and
    wherein generating sounds produced by the collision according to the spring mass model and the force components comprises clipping the spring mass model according to the force components.

2. The method according to claim 1, wherein determining the spring mass model of the object in the virtual world based on the 3D model of the object comprises:
    obtaining at least one of a mass, a stiffness coefficient, and a damp coefficient of a particle in the spring mass model of the object.

3. The method according to claim 2, wherein determining the spring mass model of the object in the virtual world based on the 3D model of the object comprises at least obtaining the mass of the particle, and wherein obtaining the mass of the particle in the spring mass model of the object comprises:
    obtaining a mass of the 3D model;
    determining a number of vertexes in the 3D model as a number of particles in the spring mass model; and
    calculating the mass of the particle in the spring mass model according to the mass of the 3D model and the number of particles in the spring mass model.

4. The method according to claim 2, wherein determining the spring mass model of the object in the virtual world based on the 3D model of the object comprises at least obtaining the stiffness coefficient of the particle, and wherein obtaining the stiffness coefficient of the particle in the spring mass model of the object comprises:
    obtaining an average length of adjacent edges for a vertex in the 3D model;
    calculating an area according to the average length of the adjacent edges as an area of the particle in the spring mass model; and
    calculating the stiffness coefficient of the particle in the spring mass model according to a preset unit-area stiffness coefficient and the area of the particle in the spring mass model.

5. The method according to claim 2, wherein determining the spring mass model of the object in the virtual world based on the 3D model of the object comprises at least obtaining the damp coefficient of the particle, and wherein obtaining the damp coefficient of the particle in the spring mass model of the object comprises:
    receiving a user inputted value or a preset value as the damp coefficient of the particle in the spring mass model.

6. The method according to claim 1, wherein calculating force components produced on the 3D model by the collision in the virtual world comprises:
    performing force analysis on the 3D model to obtain at least a transient contact force component and a friction force component produced on the 3D model by the collision.

7. The method according to claim 6, wherein clipping the spring mass model according to the force components comprises:
    obtaining a transient contact force component and a friction force component on each of a plurality of vertexes in the 3D model that correspond to respective particles in the spring mass model; and
    if the transient contact force component of a given one of the respective vertexes is less than a first predetermined threshold and the friction force component on the given one of the respective vertexes is less than a second predetermined threshold, removing from the spring mass model a particle that corresponds to the given one of the respective vertexes.

8. The method according to claim 1, wherein generating sounds produced by the collision according to the spring mass model and the force components further comprises:
    generating a sound source based on the clipped spring mass model and the force components;
    filtering the sound source;
    attenuating the filtered sound source; and
    mixing the attenuated sound source with other sound sources caused by the collision.

9. The method according to claim 1, wherein clipping the spring mass model according to the force components comprises:
    obtaining force components on respective vertexes in the 3D model that correspond to respective particles in the spring mass model; and
    if one or more force components of a given one of the respective vertexes are less than a corresponding predetermined threshold, removing from the spring mass model a particle that corresponds to the given one of the respective vertexes.

10. The method according to claim 1, wherein generating sounds produced by the collision according to the spring mass model and the force components comprises:
    generating a sound source based on the clipped spring mass model and the force components.

11. The method according to claim 10, further comprising:
    filtering the sound source;
    attenuating the filtered sound source; and
    mixing the attenuated sound source with other sound sources caused by the collision.

12. An apparatus for producing sounds in a virtual world, comprising:

determining means configured to determine a spring mass model of an object in the virtual world based on a 3D model of the object;

calculating means configured to calculate force components produced on the 3D model by a collision in the virtual world;

generating means configured to generate sounds produced by the collision according to the spring mass model and the force components;

wherein the calculating means comprises means for performing force analysis on the 3D model; and wherein the generating means comprises means for clipping the spring mass model according to the force components.

13. The apparatus according to claim 12, wherein the determining means comprises:

an obtaining unit configured to obtain at least one of a mass, a stiffness coefficient, and a damp coefficient of a particle in the spring mass model of the object.

14. The apparatus according to claim 13, wherein the obtaining unit comprises:

means for obtaining a mass of the 3D model;

means for determining a number of vertexes in the 3D model as a number of particles in the spring mass model; and means for calculating a mass of the particle in the spring mass model according to the mass of the 3D model and the number of particles in the spring mass model.

15. The apparatus according to claim 13, wherein the obtaining unit comprises:

means for obtaining an average length of adjacent edges for a vertex in the 3D model;

means for calculating an area according to the average length of the adjacent edges as an area of the particle in the spring mass model; and means for calculating the stiffness coefficient of the particle in the spring mass model according to a preset unit-area stiffness coefficient and the area of the particle in the spring mass model.

16. The apparatus according to claim 13, wherein the obtaining unit comprises:

means for receiving a user inputted value or a preset value as a damp coefficient of the particle in the spring mass model.

17. The apparatus according to claim 12, wherein the calculating means comprises:

means for performing force analysis on the 3D model to obtain at least a transient contact force component and a friction force component produced on the 3D model by the collision.

18. The apparatus according to claim 12, wherein the generating means further comprises:

means for generating a sound source based on the clipped spring mass model and the force components;

means for filtering the sound source;

means for attenuating the filtered sound source; and means for mixing the attenuated sound source with other sound sources caused by the collision.

19. The apparatus according to claim 12, wherein the means for clipping the spring mass model according to the force components comprises:

means for calculating force components on respective vertexes in the 3D model that correspond to respective particles in the spring mass model; and means for, if one or more force components of a given one of the respective vertexes are less than a corresponding predetermined threshold, removing from the spring mass model a particle that corresponds to the given one of the respective vertexes.

20. A sound card, comprising:

a processor comprising an apparatus for producing sounds in a virtual world, said apparatus for producing the sounds in the virtual world in turn comprising:

determining means configured to determine a spring mass model of an object in the virtual world based on a 3D model of the object;

calculating means configured to calculate force components produced on the 3D model by a collision in the virtual world, the analyzing means comprising means for performing force analysis on the 3D model; and generating means configured to generate sounds produced by the collision according to the spring mass model and the force components, the generating means comprising:

means for clipping the spring mass model according to the force components;

means for generating a sound source based on the clipped spring mass model and the force components;

a filter configured to filter the generated sound source;

an attenuator configured to attenuate the filtered sound source; and a mixer configured to mix the attenuated sound source with other sound sources caused by the collision.

* * * * *